United States Patent [19]

Hertz et al.

[11] 4,361,875

[45] Nov. 30, 1982

[54] MULTIPLE TONE DETECTOR AND LOCATOR

[75] Inventors: David Hertz, Akko, Israel; Robert P. Kurshan, New York, N.Y.; David Malah, Kiryat-Bialik, Israel

[73] Assignee: Bell Telephone Laboratories, Incorporated, Murray Hill, N.J.

[21] Appl. No.: 162,261

[22] Filed: Jun. 23, 1980

[51] Int. Cl.³ .............................................. G06F 15/31
[52] U.S. Cl. .................................................... 364/724
[58] Field of Search ....................... 364/724, 825, 572; 328/67

[56] References Cited

U.S. PATENT DOCUMENTS

| | | | |
|---|---|---|---|
| 3,829,670 | 8/1974 | Kebabian | 364/724 |
| 3,963,905 | 6/1976 | Gopinath et al. | 364/717 |
| 3,979,701 | 9/1976 | Tomozawa | 364/724 X |
| 4,020,332 | 4/1977 | Crochiere et al. | 364/724 |
| 4,191,853 | 3/1980 | Piesinger | 364/724 X |

OTHER PUBLICATIONS

Kurshan et al., "Digital Single Tone Generator-Detectors", *The Bell System Tech. J.*, Apr. 1976, pp. 469-496.
Cappellini, "Digital Filtering with Sampled Signal Spectrum Frequency Shift", *Proceedings of the IEEE*, Feb. '69, pp. 241-242.
Cappellini et al., "A Special-Purpose On-Line Processor for Bandpass Analysis", *IEEE Trans. on Audio & Electroacoustics*, Jun. 1970, pp. 188-194.

*Primary Examiner*—David H. Malzahn
*Attorney, Agent, or Firm*—R. O. Nimtz

[57] ABSTRACT

A system (1000) for estimating the frequency of a tone input utilizes sample rate reduction in successive stages and processing by digital cyclotomic filters at each stage. The tone input (2001) is first transformed in network (1100) to yield two quadrature tones. Digitizer (1200) converts the two tones into data words.

Buffer (1300) comprises two essentially identical storage arrangements wherein data words are stored and then supplied to succeeding stages. Frequency-shifting unit (1400) effects modulus-one multiplication by processing appropriately selected data words. Word pairs and frequency-shifted versions thereof are processed by cyclotomic filters (1500). Sequential decimation in this system effects a successively refined estimate to the tonal frequency. During each stage of decimation, the filters are configured to provide symmetric coverage of the subband containing the estimate. Configuration information is provided by decision unit (1600) via threshold comparison of the outputs from the filters and controller (1700) provides control information to the elements of the system. Rate reduction occurs on a 2:1 basis for each stage of decimation. The first frequency interval covered is one-fourth the initial sampling rate, and each stage of decimation causes a factor of two refinement in the estimate. The filters are structured as the equivalent of two pairs of first-order filters at each stage of decimation.

32 Claims, 16 Drawing Figures

MULTIPLE TONE DETECTOR AND LOCATOR

BACKGROUND OF THE INVENTION

1. Field of the Invention

This invention relates generally to spectrum analysis and, more particularly, to tone detection by discrete-time filtering.

2. Description of the Prior Art

In many diverse applications, it is necessary to detect the presence of a signal within selected frequency bands and, particularly for a signal comprising a single tone, to estimate the frequency of the tone which may appear randomly in any band. This detection and estimation is generally accomplished in conventional analog systems by utilizing a bank of filters tuned to different, narrow-band portions of the spectrum or by employing a single filter which is effectively swept across the bands of interest. Associated with such techniques, however, are the usual problems of analog processors, including unpredictability due to inherent variability of system components.

A discrete-time technique for partitioning the given frequency bands into subbands for detection purposes is described in companion references. The first is a letter by V. Cappellini entitled "Digital Filtering With Sampled Signal Spectrum Frequency Shift," published in the *Proceedings of the IEEE*, February, 1969, pages 241 and 242. The other reference is an article by V. Cappellini et al entitled "A Special-Purpose On-Line Processor for Bandpass Analysis," appearing in the *IEEE Transactions on Audio and Electroacoustics*, June, 1970, pages 188–194. In accordance with the technique of the references, the input signal (bandlimited to $\omega_m$) is sampled at the frequency $2\omega_m$ so as to alias the baseband $-\omega_m$ to 0 signal into the band $\omega_m$ to $2\omega_m$ and the sampled signal is processed in two parallel paths. In one path, the sampled signal is filtered with a time-shared, low-pass filter having an initial cutoff frequency of $\omega_m/2$, thereby developing a signal representation of the input signal's spectrum from 0 to $\omega_m/2$. In the other path, the sampled signal is shifted in frequency by $\omega_m$ by multiplying the elements of the sampled sequence by $(-1)^n$, and the shifted signal is filtered with the same low-pass filter, thereby developing a signal representation of the input signal's spectrum from $\omega_m/2$ to $\omega_m$. In this manner, the digital signals at the output of the two paths are now bandlimited to $\omega_m/2$. By reducing the sampling rate of decimating by a factor of 2, this approach can be reapplied to each of the two developed signals to obtain four signals, with each output signal now representing a different quarter of the spectrum of the input signal. In this fashion, with an increased number of decimation stages and time-sharing of a single digital filter, successively narrower bands can be evaluated. Thus, the main advantage of this decimation approach for partitioning a given frequency band into several subbands is that a single, fixed low-pass digital filter is required; bandpass analysis can be achieved efficiently with a unique digital filter having fixed coefficients at each stage of decimation.

In a variety of applications, it is known that the spectrum of interest contains, at most, a single spectral line since the input signal is a tone. When this a priori condition is known to exist, the method of Cappellini et al possesses inherent disadvantages. Since general filtering is effected at each decimation stage, numerous multiplications and additions must be performed during the filtering operations of each stage. Another disadvantage is the numerous memory locations required to store samples from the geometrically increasing number of iterated signals.

SUMMARY OF THE INVENTION

The above disadvantages of prior art systems as well as other shortcomings and limitations are obviated with the present invention of a digital tone detection system incorporating digital filters which eliminate the necessity of multiplications during filtering, thereby reducing computation load at each stage of decimation. In accordance with the circuitry and associated methodology of this invention, the input tone, comprising a frequency located randomly within the band 0 to $f_s/4$ Hz, is first transformed to yield two tones which are in quadrature relationship and which correspond to phase-shifted versions of the input tone. The quadrature tones are both initially sampled at a rate of $f_s$ Hz and then both the sampled quadrature tones and frequency-shifted versions thereof are processed by an array of first-order recursive filters. The filters are derived from the set of cyclotomic filters and have only a single resonance in the frequency range up to one-half the sampling rate. The filters are arranged so that the resonances associated with the filters and frequency-shifted versions thereof cover a band of frequencies, including the tone frequency, in symmetric fashion. Location of the subband containing the tone is achieved by comparing the magnitudes of the various filter outputs to each other and to appropriate thresholds after a fixed number of samples have been processed.

In the preferred embodiment, the filter array, comprising two filter pairs corresponding to one real and one complex first-order recursive filters, symmetrically covers the band (0, $f_s/4$) Hz. Two subbands, each of width $f_s/8$ Hz, partition the intial band (0, $f_s/4$) Hz, and the tone lies unambiguously within one subband because of oversampling. Once a tone has been located within the confines of a subband by magnitude detection and threshold comparison, sample rate reduction or decimation by a factor of two is effected. Although the tone is now undersampled, judicious choice of sample rate reduction ratio and subband width precludes additional spectral lines from appearing within the subband containing the tone. The filters are now reconfigured at the reduced sampling rate to again achieve symmetrical placement of the filter resonances across the subband of width $f_s/8$ Hz containing the tone, and the process of frequency shifting, filtering by the array and magnitude comparison is repeated. Threshold comparison is not needed after the first stage once it has been determined a signal is present during operation of the first stage. The frequency subbands utilized for resolution at the output of this second stage of detection are each of width $f_s/16$ Hz. Again, the subband containing the tone is isolated, and another decimation stage is effected. The processing continues in this manner until the desired frequency resolution has been achieved.

Moreover, a minor modification to the preferred embodiment of the present invention enables the system to test for two tones, provided one tone is initially located in the band (0, $f_s/4$) Hz and the second tone is in the band ($f_s/4$, $f_s/2$) Hz.

The organization and operation of this invention will be better understood from a consideration of the detailed description of an illustrative embodiment thereof, which follows, when taken in conjunction with the accompanying drawing.

DETAILED DESCRIPTION

Figure 1:
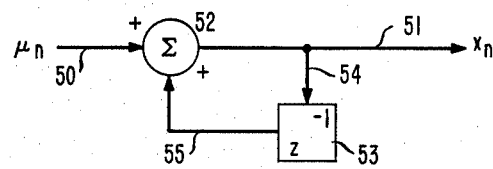
FIG. 1 depicts cyclotomic digital filter $C_1$, considered as exemplary of the linear recursive filters of interest, in block diagram form.

For clarity of exposition, it is helpful to first provide an overview of the properties of the first-order recursive filters utilized in the illustrative embodiment. Next, a detailed discussion of the time and frequency domain characteristics of one first-order filter (designated $C_1$), treated as exemplary of the remaining filters of interest (designated $C_2$, $C_{4p}$ and $C_{4m}$), is presented to illustrate foundational concepts helpful to fully comprehend the overall tone detection system. Finally, the technique for exploiting the properties of the individual filters to form a composite tone detection system is elucidated.

1. Cyclotomic Filters

The properties of the cyclotomic filters discussed herein are presented in greater detail in U.S. Pat. No. 3,963,905, issued to Gopinath et al on June 15, 1976, as well as a paper entitled "Digital Single-Tone Generator-Detectors," by R. P. Kurshan and B. Gopinath, published in the Bell System Technical Journal, April, 1976, pages 469–496. The full disclosures of these references are incorporated herein by reference. However, sufficient detail is extracted from these references to ensure an understanding of and insight into the present invention.

Cyclotomic filters are a class of digital filters having only poles in the transfer function and, moreover, each pole lies on the unit circle in the z-transform domain. This means that the filters are inherently unstable and are not suitable for conventional filtering operations which require the processing of numerous contiguous samples. In fact, these filters behave more like resonators and it is this property that can be beneficially utilized for tone detection. The salient advantage of this type of resonating filter is that the filters of primary interest exhibit nonzero coefficient values ($\pm 1, \pm j$) having a modulus of one. This implies that multiplications of samples by filter coefficients reduce to simple addition, subtraction and signal interchange operations and, significantly, arithmetic errors such as round-off and truncation errors are eliminated.

A cyclotomic filter may be described in terms of a linear recursion relation whose characteristic polynomial is a cyclotomic polynomial. For example, for a first order digital filter represented by the linear difference equation (LDE)

$$x_n = x_{n-1} + \mu_n,$$

where $\mu_n$ and $x_n$ are input and output sequence elements corresponding to the $n^{th}$ sample, the characteristic equation is given by the polynomial $\lambda - 1$ (as derived from $x_n - x_{n-1} = 0$). This polynomial is cyclotomic and has the designation $C_1(\lambda)$ (or $C_1$ for simplicity): $C_1(\lambda) = \lambda - 1$. Similarly, the cyclotomic polynomial $C_2(\lambda) = \lambda + 1$ yields a digital filter described by the LDE $$x_n = -x_{n-1} + \mu_n.$$

Other filters of special interest include two first-order, complex filters derived as the roots of the second-order cyclotomic polynomial $C_4(\lambda) = \lambda^2 + 1$. These filters also have roots on the unit circle and are given by (with $j = \sqrt{-1}$) $C_{4p}(\lambda) = \lambda - j$ and $C_{4m}(\lambda) = \lambda + j$; they have the following LDE representations, respectively:

$$x_n = jx_{n-1} + \mu_n$$

and $$x_n = -jx_{n-1} + \mu_n.$$

FIG. 1 depicts the $C_1$ digital filter in block diagram form. The input and output sequence elements $\mu_n$ and $x_n$ appear on lines 50 and 51, respectively. The output, via lead 54, is also fed back to adder 52 via unit delay device 53 and lead 55. Similar block diagrams obtain for the other first-order filters.

2. Filter Characteristics

To elucidate the desired characteristics obtained by combining cyclotomic-derived filters into a system architecture, the response of a general filter to an input tone having a randomly distributed phase component must first be presented. The input tone is presumed to have the analog form $A \cos(2\pi ft + \phi)$, where $\phi$ is the phase random variable, A is the amplitude and f is the tone frequency.

The impulse response sequence of the general recursive filter is represented by $\{h_k\}$, where $k \geq 0$. The output sequence elements may then be obtained from the convolutional relationship (which is one technique for representing the solution to an LDE)

$$x_n = \sum_{k=0}^{n} \mu_k h_{n-k}, \quad (1)$$

where $\{\mu_k\}$ is the input tone sequence obtained by sampling $A \cos(2\pi ft + \phi)$, $t \geq 0$, at the rate $f_s$ Hz, that is, $$\mu_k = A \cos(k\theta + \phi),$$

where $\theta = 2\pi f/f_s$.

The solution to equation (1) has the form $$x_n = \sqrt{\alpha_n^2 + \beta_n^2} \sin\left[\tan^{-1}\left(\frac{\alpha_n}{\beta_n}\right) - \phi\right], \quad (2)$$

where $$\alpha_n = Re\left[\sum_{k=0}^{m} Ae^{jk\theta} h_{n-k}\right], \quad (3)$$

$$\beta_n = Imag\left[\sum_{k=0}^{n} Ae^{jk\theta} h_{n-k}\right], \quad (4)$$

and the operators denoted "Re" and "Imag" produce the real and imaginary parts of the bracketed part of equations (3) and (4), respectively.

Since $\phi$ occurs randomly within the interval $(0, 2\pi)$ radians, comparison of $|x_n|$ to a threshold may yield deleterious results due to the dependency of $x_n$ on $\phi$. However, by utilizing the first-order filters in pairs (either actually or on a time-shared basis), the undesirable modulation effects of the random phase component may be eliminated.

This is achieved by forming a new sample sequence $\{\delta_k\}$ found by sampling the quadrature tone $A\sin(2\pi ft + \phi)$, which may be derived through a Hilbert transform operation on the original or in-phase input tone. The new sequence elements are given by $$\delta_k = A\sin(k\theta + \phi), \quad k > 0.$$

If $\{\delta_k\}$ is processed by a recursive filter identical to the one which processes $\mu_k$, then the new output sequence $\{y_n\}$ has elements $$y_n = \sqrt{\alpha_n^2 + \beta_n^2} \cos\left[\tan^{-1}\left(\frac{\alpha_n}{\beta_n}\right) - \phi\right]. \quad (5)$$

A squaring operation on both equations (2) and (5), followed by a summation and square-root operation yields an output $\sqrt{\alpha_n^2 + \beta_n^2}$ which is independent of $\phi$.

For future discussion, it is convenient, as exemplified by the form of equations (3) and (4), to define a complex input tone having sample values $Ae^{j(k\theta + 100)}$ and a corresponding output sequence $\{z_n\}$ having complex element values $$z_n = \sum_{k=0}^{n} Ae^{j(k\theta + \phi)} h_{n-k}. \quad (6)$$

The magnitude or modulus of each element of $\{z_n\}$ is then given by $$|z_n| = \left|\sum_{k=0}^{n} Ae^{jk\theta} h_{n-k}\right| = \sqrt{\alpha_n^2 + \beta_n^2}. \quad (7)$$

As hereinafter utilized, the two-filter device characterized by substantially identical filters $C_i$ ($i = 1, 2, 4p$ or $4m$), which processes in-phase and quadrature samples of an input signal in pairs, is a basic or foundational element of the tone detection system.

Whereas the above discussion has focused primarily on sequence domain manipulations, it is helpful to visualize these manipulations in the frequency domain. Moreover, whereas the discussion was couched in terms of generalized impulse responses, particularly pertinent to the subsequent discussion are the frequency domain responses of filters $C_1$, $C_2$, $C_{4p}$ and $C_{4m}$. $C_1$, having impulse elements $h_n = 1$, $n \geq 0$, is treated as exemplary.

Utilizing now the notation $z(C_1, n, \theta)$ to distinguish sequence elements of $\{z_n\}$ so as to explicitly set forth the dependence upon $C_1$, n and $\theta$, the following obtains by substituting $h_n - 1$ into equation (7):

$$|z(C_1, n, \theta)| = A\left|\sum_{k=0}^{n} e^{jk\theta}(1)\right| \quad (8)$$

or $$z(C_1, n, \theta) = A\left|\frac{\sin\left(\frac{n+1}{2}\right)\theta}{\sin\frac{\theta}{2}}\right|. \quad (9)$$

In addition, because the impulse response of $C_2$ is $(-1)^n$, $n \geq 0$, $$|z(C_2, n, \theta)| = |z(C_1, n, \theta + \pi)|. \quad (10)$$

Figure 2:
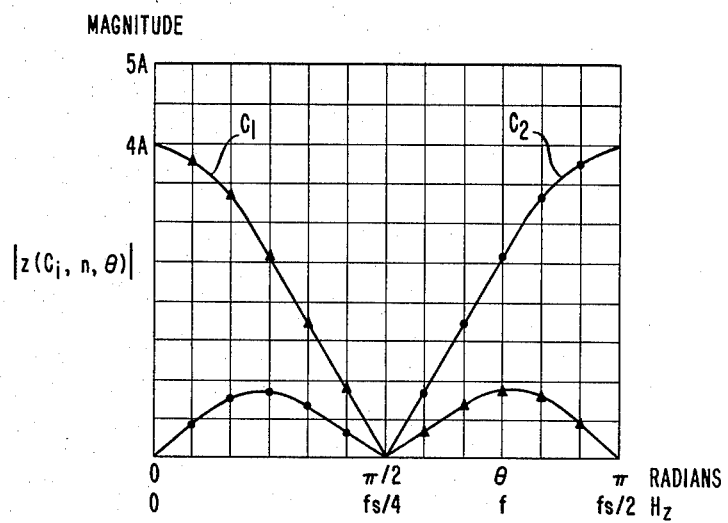
FIG. 2 shows the responses from filter pair $C_1$ and filter pair $C_2$, each processing real and imaginary sampled tones in parallel, over the range from 0 to one-half of the sampling rate with 4 samples.

FIG. 2 shows plots of $|z(C_1, n, \theta)|$ and $|z(C_2, n, \theta)|$ over the range (0 to $\pi$) radians for $n = 3$, that is, four samples corresponding to $n = 0, 1, 2$ and 3 have been processed. The resonating feature of the filters is apparent. Filter $C_1$ is symmetric with respect to $\theta = 0$, whereas $C_2$ is symmetric about $\theta = \pi$, and both are periodic with period $2\pi$. Since $\theta = 2\pi f/f_s$, $\theta = \pi$ corresponds to a frequency f which is one-half the sampling rate. Although the filter response has been illustrated with four samples, the filter may also be operated with 2, 3, 5, 6 or 7 samples. In fact, some enhancement in the signal-to-noise performance obtains when more than four samples are processed.

In a similar manner, the following relations may also be derived:

$$|z(C_{4p},n,\theta)| = A \left| \frac{\sin\left(\frac{n+1}{2}\right)\left(\theta - \frac{\pi}{2}\right)}{\sin\left(\theta - \frac{\pi/2}{2}\right)} \right| \quad (11)$$

and $$|z(C_{4m},n,\theta)| = A \left| \frac{\sin\left(\frac{n+1}{2}\right)\left(\theta + \frac{\pi}{2}\right)}{\sin\left(\theta + \frac{\pi/2}{2}\right)} \right|. \quad (12)$$

Because of the manner in which $C_{4p}$ and $C_{4m}$ are related to C, $$\left| z\left(C_{4p},n,\theta + \frac{\pi}{2}\right) \right| = \left| z\left(C_{4m},n,\theta - \frac{\pi}{2}\right) \right| = |z(C_1,n,\theta)|. \quad (13)$$

Figure 3:
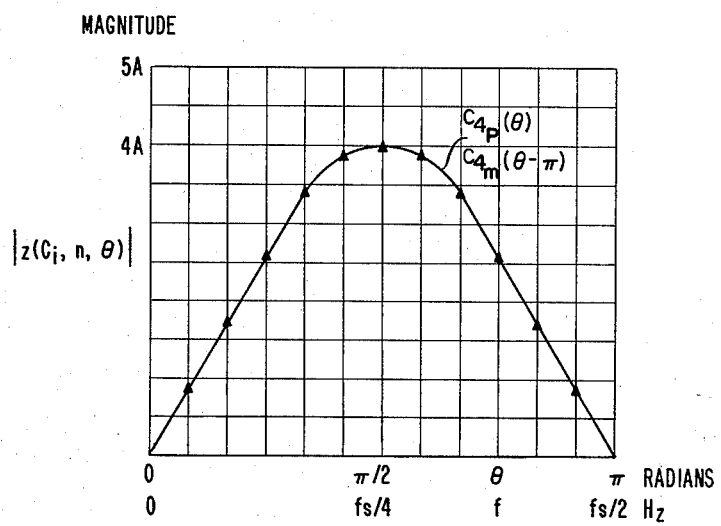
FIG. 3 shows the response from complex, recursive filter pairs $C_{4p}$ and $C_{4m}$ to the same scale and over the same range of frequency as in FIG. 2.

FIG. 3 shows plots of $|z(C_{4p},n,\theta)|$ and $|z(C_{4m},n,\theta-\pi)|$ for the same parameters as FIG. 2.

Figure 4:
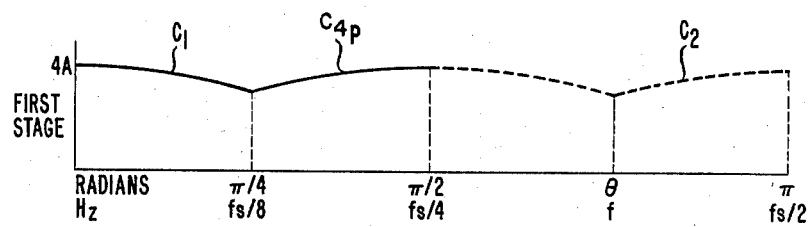
FIG. 4 depicts the arrangement of three first-order recursive filters which cover the frequency band from 0 to one-half of the sampling rate.

From the plots of FIGS. 2 and 3, it is concluded that the filter response from each two-filter device comprising identical filters $C_i$ (i=1, 2, 4p or 4m), have only a single resonance in the frequency range up to one half of the sampling frequency. The tone detection system in accordance with the present invention exploits these filter pairs by covering the frequency band from 0 to $f_s/4$ ($\theta$ from 0 to $\pi/2$) in symmetric fashion. Such an arrangement is depicted in FIG. 4. Since $C_{4p}$ and $C_{4m}$ are merely phase shifted versions of $C_1$ and it appears that $C_{4p}$ and $C_{4m}$ require complex manipulations, it is important to determine if a modified, real sequence can serve as an input to a $C_1$ filter to produce an output equivalent to a $C_{4p}$ or $C_{4m}$ filter output.

Phase-shifting by $\pm\pi/2$ in the frequency domain is equivalent to introducing modulation factors in the sequence (sampled time) domain of the form $\{e^{\pm jk\pi/2}\}$. Thus, if the complex input sequence is modified by the modulation sequence, a new sequence having element values $$A e^{j(k(\theta+\pi/2)+\phi)} \quad (14)$$

gives rise to an output corresponding to $C_{4p}$ or $C_{4m}$, as appropriate. The in-phase and quadrature sequences associated with this complex input sequence become, respectively, $$A \cos(k\theta+\phi)\cos(k\pi/2) \mp A \sin(k\theta+\phi)\sin(k\pi/2) \quad (15)$$

and $$A \sin(k\theta+\phi)\cos(k\pi/2) \pm A \cos(k\theta+\phi)\sin(k\pi/2). \quad (16)$$

Since k is an integer $\geq 0$, the shifted in-phase sequence reduces to a sequence which is periodic of period four having element values for k=0, 1, 2 and 3 of (from equation (15)):

$$A \cos(k\theta+\phi); \mp A \sin(k\theta+\phi); -A \cos(k\theta+\phi); \pm A \sin(k\theta+\phi). \quad (17)$$

Similarly, the shifted quadrature sequence has elements for k=0, 1, 2, 3 (equation (16)) of:

$$A \sin(k\theta+\phi); \pm A \cos(k\theta+\phi); -A \sin(k\theta+\phi); \mp A \cos(k\theta+\phi). \quad (18)$$

Perusal of equations (17) and (18) results in the realization that the operation of phase-shifting by $\pm\pi/2$, rather than occurring through frequency domain manipulations, may be straightforwardly implemented in the sequence or sample domain merely by interchanging and changing signs of the in-phase and quadrature inputs to a filter pair, when appropriate. Because of the form of equation (14), such an implementation may be referred to as a modulus-one multiplier or ($j^{\pm k}$) frequency-shifter.

Figure 5:
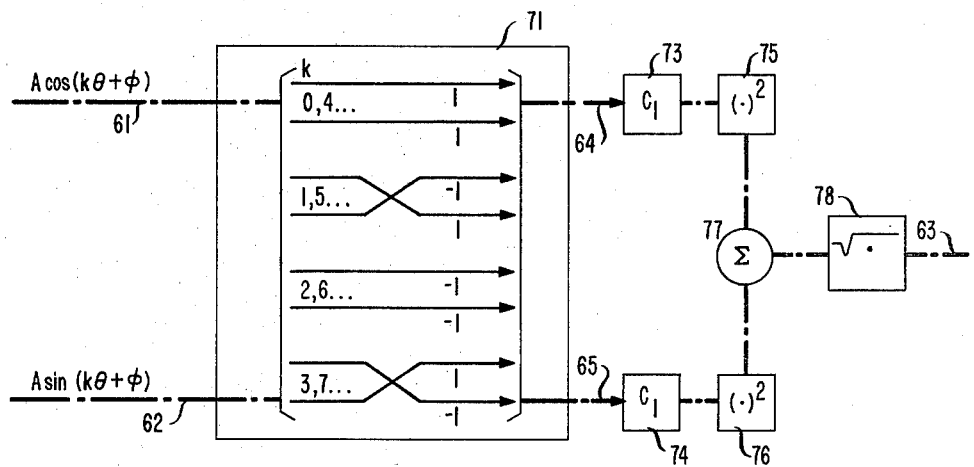
FIG. 5 shows a block diagram representation of a modulus-one multiplier or frequency-shifting device.

A block diagram representation of the modulus-one multiplier for the case of a $(\pi)/(2)$ phase shift ($C_{4p}$) is shown in FIG. 5. Lines 61 and 62 provide the original in-phase and quadrature sequence elements to frequency-shift unit 71. The operations of sign changing and line interchanging occur within unit 71, as depicted for k=0, 1, ..., 4, .... Lines 64 and 65 provide shifted in-phase and quadrature sequence elements, respectively, to two identical $C_1$ filters 73 and 74. After the separate squaring operations in devices 75 and 76, summing in device 77 and then square-rooting in device 78, line 63 provides the output having the shifted frequency response described above by $C_{4p}$. The operations of squaring, summing and square-rooting may be referred to variously as a magnitude or a modulus operation.

Figure 6:
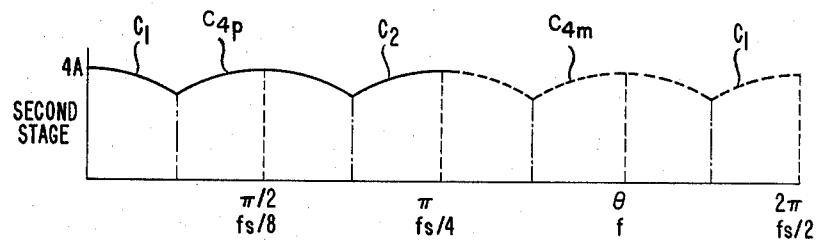
FIG. 6 depicts, on the same scale as FIG. 4, the arrangement of four recursive filters which cover the band from 0 to one-half of the initial sampling rate and are symmetric over the four subbands shown in FIG. 4.
Figure 7:
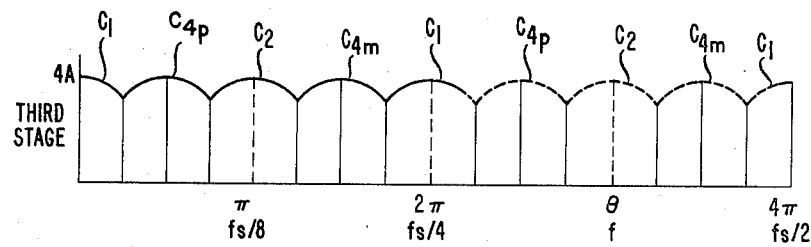
FIG. 7 depicts, on the same scale as FIG. 4, the arrangement of eight recursive filters which cover the band from 0 to one-half of the initial sampling rate and are symmetric over the eight subbands shown in FIG. 6.

FIGS. 6 and 7 depict how each of the two subbands in the range 0 to $\pi/2$ radians of FIG. 4 may be further partitioned to isolate the tone of interest. Basically, the subbands are subdivided into second-stage subbands by reducing the sampling rate and reconfiguring the filter array within each subband of interest. For instance, the first stage subband labelled $C_1$ in FIG. 4 has been subdivided by reducing the sampling rate by a factor of 2 and covering the old subband by $C_1$, $C_{4p}$ which effects two second-stage subbands symmetrically dispersed across the original subband. Further sample rate reduction by a factor of two results in the partition of FIG. 7. The configuration and covering of FIG. 6 occurs within each subband during each stage of decimation after the first stage.

Figure 8:
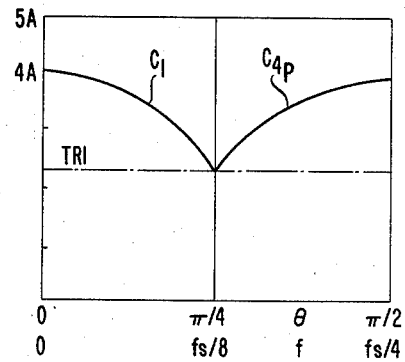
FIG. 8 is an isolated view of the band from 0 to $f_s/4$ as shown in FIG. 4 depicting the placement of the decision threshold TR1.

To understand how a tone can be isolated and detected by processing with consecutive stages of decimation, the steps in processing a single tone of frequency $f_0$ are now considered. For the tone initially sampled at a rate $f_s$ Hz, spectral lines occur in the digital spectrum at $\pm f_0$, $\pm f_s \pm f_0$, $\pm f_s \pm 2f_0$, and so forth. The sampling rate is chosen so that the tone falls within the range 0 to $f_s/4$ Hz ($0<f_0<f_s/4$); thus the tone may be unambiguously determined to fall within one of the subbands or cells (0, $f_s/8$) or ($f_s/8$, $f_s/4$), by processing the outputs from the filter array or bank configured as $C_1$, $C_{4p}$. This is basically accomplished by comparing each filter output to one another and to a threshold, as depicted in FIG. 8. Threshold TR1 applies to both filters $C_1$ and $C_{4p}$ and is obtained by evaluating equation (9) for $\theta=\pi/4$. If the threshold is exceeded by either output, the tone is judged to be present. To find the correct subband, the outputs are compared to each other. Although the threshold has been set by evaluating equation (9) for $\theta=(\pi)/(4)$, the threshold may be set at any other appropriate level that will detect the signal in the presence of noise. Once detected, thresholding is no longer required during succeeding stages of decimation.

If the tone samples are now decimated by a factor of two, that is, only every second sample value from the original set of samples is retained, then spectral lines appear at $\pm f_0$, $\pm f_s/2 \pm f_0$; $\pm f_s/2 \pm 2f_0$, and so forth. By selecting the 2:1 ratio between initial sample rate and reduced sample rate and by selecting cell widths of $f_s/8$ for the first stage of sampling, no additional spectral components fall within the original subband containing baseband spectral lines $\pm f_0$. This is true even though aliasing occurs because the judicious selection of cell width and reduced sample rate precludes aliased spectral lines from appearing in the subband containing the spectral line of interest. In addition, only a comparison between the two filter outputs is now required since the tone is already deemed to be present by the earlier threshold comparison. Comparisons are not sensitive to the amplitude A; only TR1 is a function of A.

The process described with respect to the decimation by a factor of two may continue until the desired resolution (final cell width) is achieved. In FIGS. 4, 6, and 7, three stages of processing are exemplified. The tone will thus be resolved to a cell of width $f_s/32$.

From the description with respect to the band from 0 to $f_s/4$, it is also apparent that a tone in the band $f_s/4$ to $f_s/2$ could be processed in an analogous manner. Thus, two separate tones could be detected provided each is located in separate halves of the band 0 to $f_s/2$ upon initial sampling.

3. Illustrative Embodiment

Figure 9:
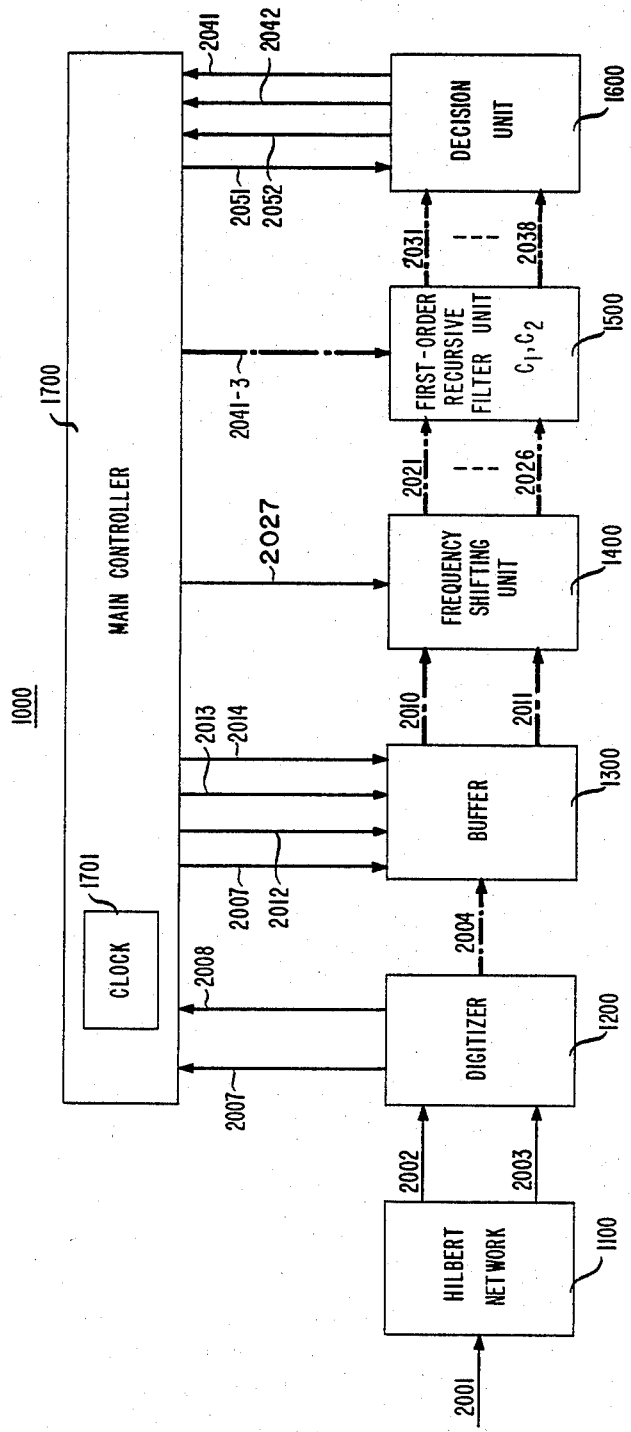
FIG. 9 is a block diagram of a complete embodiment of a first-order tone detecting system in accordance with the present invention.

An illustrative implementation of a complete digital tone detection system incorporating pairs of filters $C_1$, $C_2$, $C_{4p}$ and $C_{4m}$ is shown in block diagram form in FIG. 9. The system (designated 1000) in accordance with the present invention generally comprises the following seven interrelated subsystems: Hilbert network 1100; digitizer 1200; buffer 1300; frequency shifting unit 1400; first-order recursive filter unit 1500; decision unit 1600; and main controller 1700. Elements 1100 through 1600 are connected in cascade, whereas controller 1700 serves as the primary source for generating control signals as well as an interface for feeding forward and feeding back secondary control signals from elements 1200 through 1600.

Hilbert network 1100 is a $\pi/2$ phase-shifting network designed to process the analog tone appearing on lead 2001; this tone is represented by A cos $(2\pi ft + \phi)$. The outputs from network 1100 have the following form: A cos $(2\pi ft + \phi_1)$ and A sin $(2\pi ft + \phi_1)$; these analog signals appear on leads 2002 and 2003, respectively. The new phase $\phi_1$ is also randomly distributed over $(0.2\pi)$. In the description that follows, it is convenient to refer to the signal A cos $(2\pi ft + \phi_1)$ as the in-phase or real tone, whereas A sin $(2\pi ft + \phi_1)$ is called the quadrature or the imaginary tone. Moreover, the frequency f is presumed to lie within the range from 100 Hz to 10 kHz.

Figure 10:
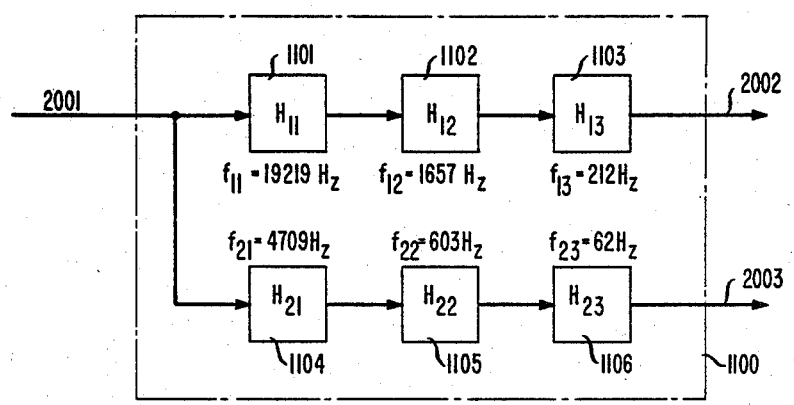
FIG. 10 is a block diagram representation of the Hilbert network of FIG. 9.

FIG. 10 discloses one design for Hilbert network 1100 which ensures that the real and imaginary tones are within about 1.5 degrees of the require 90-degree phase difference between them over the band from 100 Hz to 10 kHz. The tone on lead 2001 is processed in the upper branch of network 1100 by the cascade of three networks designated 1101, 1102 and 1103. Each of these three networks has the topology shown in FIG. 11. The transfer function relating the voltage on lead 1111 to the voltage on lead 1110 is given by $$H_{ij}(s) = \frac{1 - s\tau_{ij}}{1 + s\tau_{ij}}$$

where $$\tau_{ij} = \frac{1}{2\pi f_{ij}} = R_{ij}C_{ij}.$$

The values of $f_{ij}$ for each network $H_{ij}$, as shown in FIG. 10, are: $f_{11} = 19{,}219$ Hz; $f_{12} = 1657$ Hz; and $f_{13} = 212$ Hz.

Figure 11:
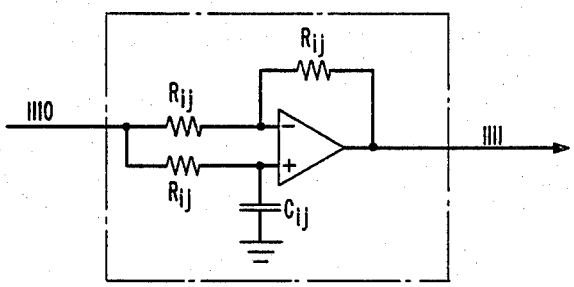
FIG. 11 is a circuit diagram indicating one form of the all-pass elements shown in FIG. 10.

The bottom branch in FIG. 10, comprising the cascade of networks 1104, 1105 and 1106, processes the tone on lead 2001 to yield the quadrature tone appearing on lead 2003. Again the topology of each of these networks is shown in FIG. 11. The values of $f_{ij}$ for each network $H_{ij}$, again as depicted in FIG. 10, are: $f_{21} = 4709$ Hz; $f_{22} = 603$ Hz; and $f_{23} = 62$ Hz.

Digitizer 1200 receives the real and imaginary analog tones from Hilbert network 1100 and samples these tones to obtain discretized versions of the two analog signals. The sampled signals may be either sampled data signals (discretized time) or digital signals (discretized time and amplitude).

Figure 12:
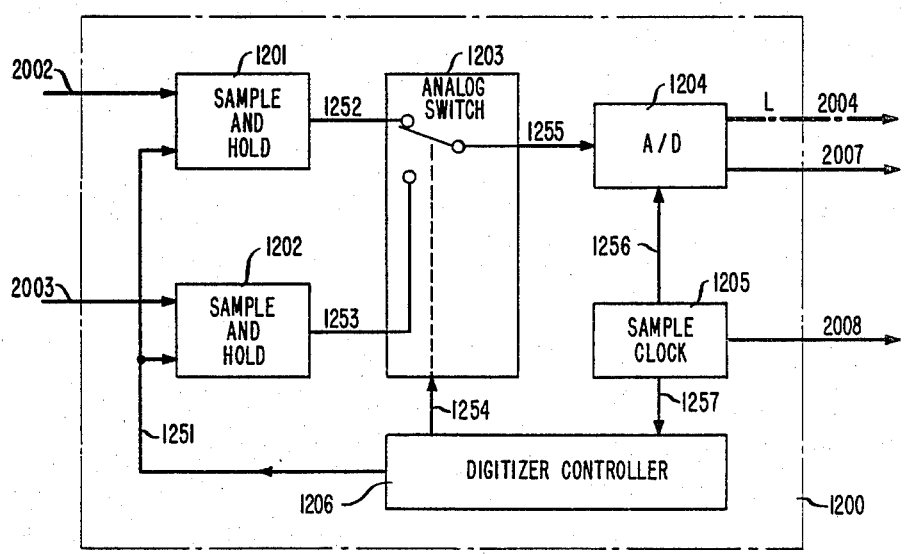
FIG. 12 is a block diagram of one form of the digitizer unit in FIG. 9.

For the digital case, FIG. 12 depicts an illustrative embodiment of digitizer 1200 in block diagram form. The purpose of this embodiment is to convert the real and imaginary tones into L-bit data words using only a single analog-to-digital (A/D) converter. The real and imaginary components on leads 2002 and 2003, respectively, are simultaneously sampled and held by devices 1201 and 1202, respectively. Digitizer controller 1206, via lead 1251, switches devices 1201 and 1202 between sample and hold states at the appropriate time instants. During a hold inter al, analog switch 1203, as directed by controller 1206 via lead 254, alternately switches between leads 1252 and 1253 to supply A/D converter 1204, via lead 1255, with the real and imaginary sampled data signals. Two L-bit words representing the digital versions of the analog signals appear sequentially on channel 2004, which has L parallel leads to transmit each L-bit word. The first word in the sequence corresponds to the real input tone whereas the second word corresponds to the imaginary tone. Lead 2007 provides a signal to main controller 1700 indicating that digitizing is complete and that the two output words, on channel 2004, are available for further processing. Sample clock 1205 provides timing information to controller 1206 and converter 1204 via leads 1256 and 1257, respectively. In addition, clock 1205 feeds forward a synchronizing signal to controller 1700, via lead 2008, to insure overall system synchronization. For an input tone in the range from 100 Hz to 10 kHz, the frequency of clock 1205 is at least 40 kHz. (For a two-tone detection system, the first tone may be considered to lie within the range 0.1 to 5 kHz, whereas the second tone is constrained to the range 5 to 10 kHz and the clock is at least 20 kHz).

Figure 13:
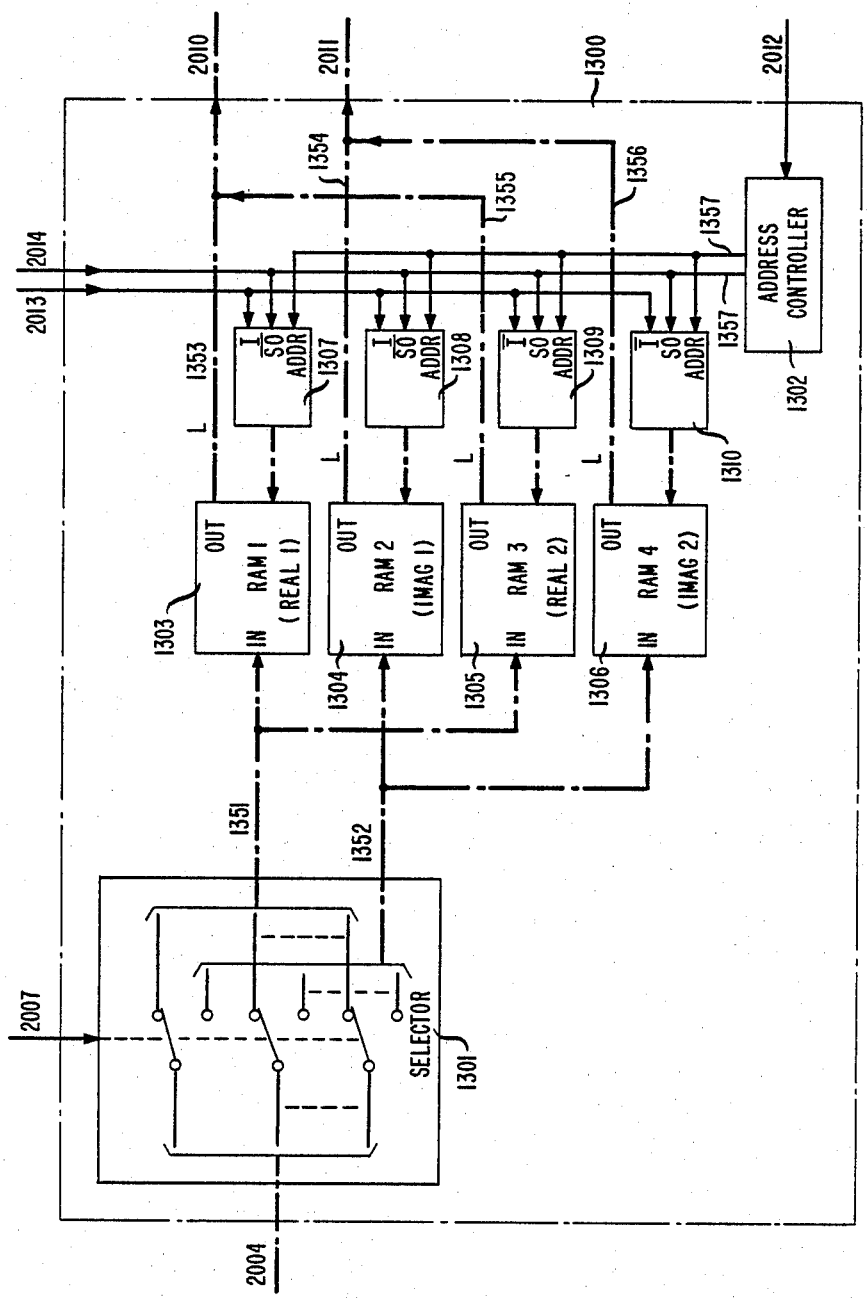
FIG. 13 is a block diagram of one form of the buffer device in FIG. 9.

Buffer 1300 comprises two essentially identical storage arrangements. While one arrangement provides input information to the remaining stages, the other storage arrangement is being loaded, and vice versa. FIG. 13 depicts, in block diagram form, an illustrative embodiment of buffer 1300. Random access memory (RAM) element 1303 and RAM controller 1307, as well as companion RAM element 1304 and RAM controller 1308 form one storage arrangement. The other storage arrangement comprises RAM devices 1305 and 1306 and associated controllers 1309 and 1310. RAM elements 1303 through 1306 utilize M-by-L bit memories where M is related to the number of samples processed by the filter (N) and the number of decimation stages (D). In the above overview description, three decimation stages, each reducing sampling by a factor of two, were illustrated for the case of recursive filters processing groups of four samples. Therefore $M \geq 1+(4-1)2^{3-1}=13$; in general $M \geq 1+(N-1)2^{D-1}$. In practice, a standard, commercially available random access memory device is utilized for elements 1303 through 1306; in this case, say for L=4 bits, a 16×4-bit word memory is a convenient selection. A total time of about (13/40 kHz) milliseconds is needed to sample and store the digitized signals in each storage arrangement.

Selector 1301 in FIG. 13, in response to A/D converter 1204 (see FIG. 12) via lead 2007, alternately directs real and imaginary samples to the proper storage devices. For instance, a signal on enable lead 2013, supplied by main controller 1700, indicates which memory pair, 1303,1304 or 1305,1306, is enabled to accept samples arriving on channel 2004. The enable signal is provided by selection logic within RAM controllers 1307 through 1310; controllers 1307 and 1308 are phased-reversed with respect to controllers 1309 and 1310. RAM devices 1303 and 1305, both connected to selector 1301 via channel 1351 comprising L leads, and devices 1304 and 1306, connected to selector 1301 via channel 1352 having L leads, are alternately connected to channel 2004 through selector 1301. If memory pair 1303,1304 is enabled to accept samples, the samples appearing on channels 1351 and 1352 are directed to the proper storage locations in memory pair 1303,1304.

For convenience in discussing particular samples, the first sample is denoted "0" and is presumed to be stored at memory location O; the next sample, "1," is stored at location 1, and so forth. Moreover (0,1,2,3) designated an array of samples comprising the first four samples serially emitted from any output channel 1353 through 1356, each of which comprises L leads in parallel. Similarly, (0,2,4,6) designates a serially ordered and emitted array of length four formed by selecting every second sample. Finally, (0,4,8,12) designates an array of length four formed by including every fourth sample. These are the arrays processed by recursive filter unit 1500 at each stage of decimation. The arrays are supplied by buffer 1300 during appropriate time intervals with the aid of address controller 1302. The signal supplied by main controller 1700 on channel 2012 indicates the stage of decimation; for three stages, the indicator would be either 1, 2 or 3 in appropriately coded format (e.g., binary; 01, 10, 11). If the indication is that stage one is operational, address controller 1302 generates an address array to direct, via lead 1357, RAM controllers 1307 through 1310 to sequentially select samples "0," "1," "2" and "3." The shift-out signal appearing on lead 2014, as provided by main controller 1700, causes the data to be shifted from the proper memory pair in sequential fashion. For example, if memory pair 1303,1304 has an input disable on lead 2013, then: the first shift-out signal on lead 2014 causes sample "0" of the real tone to appear on channel 1353 simultaneously with the appearance of sample "0" of the imaginary tone on channel 1254; the next shift-out signal outputs samples "1" of the real and imaginary tones to channels 1353 and 1354, respectively. This process continues until the four samples have been read out.

If the indication on lead 2012 is that decimation stage two is operational, then the sequential shift-out signals on lead 2014 cause the real and imaginary "0" samples to appear on channels 1353 and 1354, respectively, followed by the "2" samples, and so forth. A stage three indication causes the sequence of samples "0," "4," and so forth.

The appropriate real and imaginary samples appear sequentially on channels 2010 and 2011, respectively. Channel 2010 is formed by bridging real output channels 1353 and 1355, whereas channels 1354 and 1356 from the imaginary memory pair 1304,1306 are connected to form channel 2011.

Figure 14:
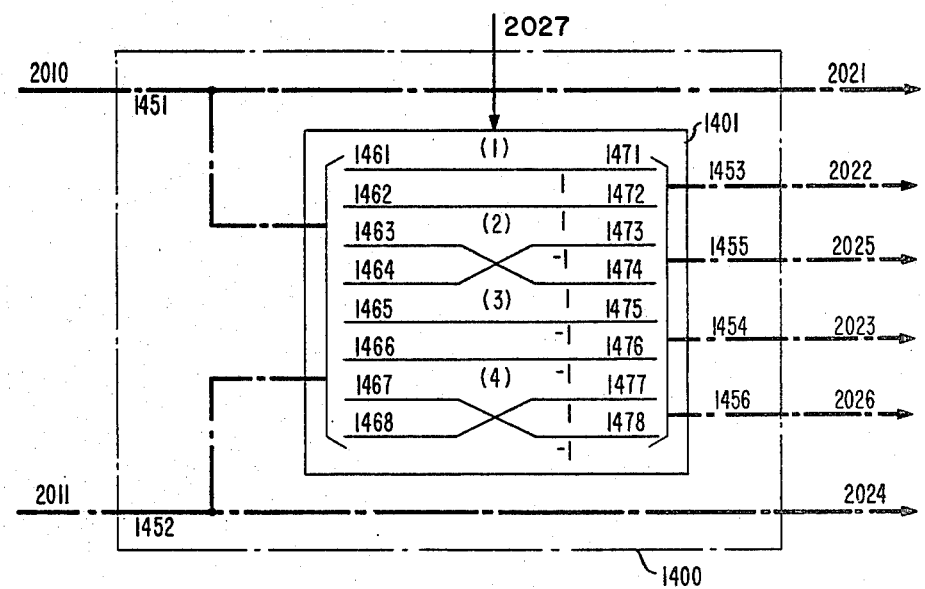
FIG. 14 is a schematic diagram of one form of the frequency-shifting unit from FIG. 9.

Frequency shifting unit 1400 effects modulus-one multiplication. FIG. 14 depicts an embodiment of a modulus-one multiplier (for a $\pi/2$ frequency domain shift) in block diagram form. The multiplication is accomplished basically by interchanging real (in-phase) and imaginary (quadrature) data words, when required, and changing sign, also when required. Element 1401 accomplishes the interchanging and multiplication under control of main controller 1700, via lead 2027, which provides the signal indicating the sample number (1 through 4) to be processed. The inputs to element 1401 are the real and imaginary data words arriving on channels 2010 and 2011, respectively. Although channels 2010 or 2011 comprise L parallel leads, for the sake of clarity, channels 2010 and 2011 are represented by single lines 1451 and 1452 in FIG. 14. Similarly, output channels 2021 through 2024, while comprising L parallel leads, are represented by lines 1451, 1453, 1454 and 1452, respectively. The operation of element 1401 on a sample-by-sample basis is summarized by the following interconnection table:

| Sample Number (lead 2025) | 1451 | 1452 | 1453 | 1454 |
|---|---|---|---|---|
| | | | (connect to) | |
| 1 | 1461 | 1462 | 1471 | 1472 |
| 2 | 1463 | 1464 | 1473 | 1474 |
| 3 | 1465 | 1466 | 1475 | 1476 |
| 4 | 1467 | 1468 | 1477 | 1478 |

Moreover, as depicted in FIG. 14, the signal on line 1471 is the same as the signal on line 1461, the signal on lead 1473 is the negative of the signal on lead 1464, and so forth. Thus, the words appearing sequentially on line pair 1453,1454 correspond to the $-\pi/2$ frequency-shifted versions of the real and imaginary words appearing on line 1451,1452. In a similar fashion, the words appearing sequentially on line pair 1455,1456 correspond to the $(+\pi)/(2)$ frequency shifted versions of the real and imaginary words on line 1451,1452.

Figure 15:
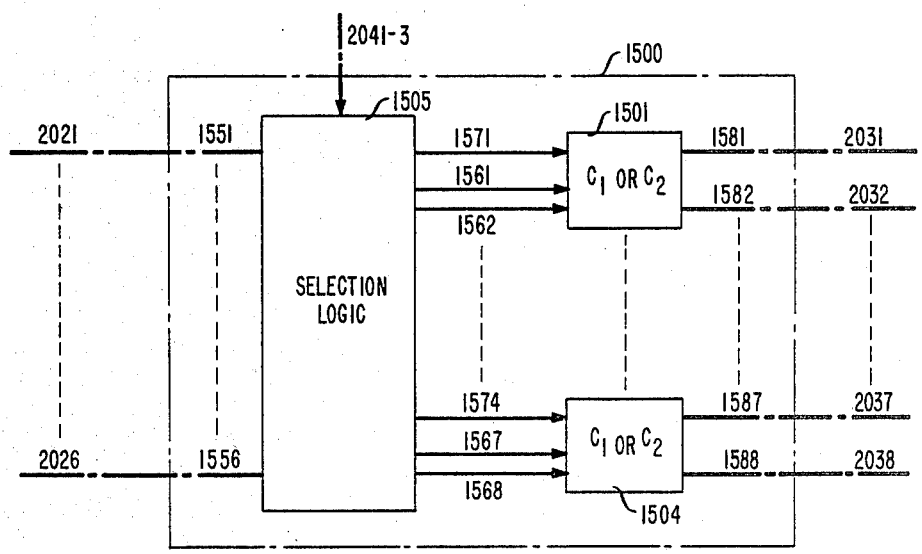
FIG. 15 is a block diagram of the first-order recursive filter unit shown in FIG. 9.

An illustrative embodiment of first-order, recursive filter unit 1500 is shown in block diagram form in FIG. 15. Four pairs of filters are shown; two pairs of filters process the band from 0 to $f_s/4$ Hz, and if a second tone is to be detected, the second pair of filters process the band from $f_s/4$ to $f_s/2$ Hz. In FIG. 15, filter elements 1501 and 1502, each comprising a pair of substantially identical filters, process the tone in (0, $f_s/4$). Filter elements 1503 and 1504, also comprising two filters each, process the second tone when required. In each element 1501 through 1504, one filter processes the real data words whereas the companion filter processes the associated imaginary data words. In addition, elements 1501 through 1504 may be configured to operate as either a $C_1$ or $C_2$ filter pair in response to the configuration signals present on leads 1571 through 1574.

The sequence of signals appearing on lead 2041 (and 2042 for a two-tone system), as provided by the main controller 1700, indicates the part of the frequency spectrum that is to be searched during the present processing stage. This information is supplied to controller 1700 from results generated by decision unit 1600 during the preceding stages of decimation. The signal on lead 2043, also provided by controller 1700, indicates the number of the decimation stage undergoing processing.

Selection logic 1505, based on the present stage number on lead 2043 and frequency spectrum information provided by the sequence of signals on leads 2041 and 2042, interconnects appropriate input channels 1551 through 1556 to intermediate channels 1561 through 1568. Again, although channels 1551 through 1566 and channels 1561 through 1568 comprise L-bit leads, they are shown as single lines in FIG. 15. Line pair 1551,1554 has the real and imaginary words whereas line pair 1552,1553 supplies the $-\pi/2$ frequency shifted versions of the real and imaginary words and line pair 1555,1556 supplies the $+\pi/2$ frequency shifted versions. The following tables summarize the input-output relations for selection logic 1505 presuming only one tone, located in the band $(0, f_s/4)$ Hz, is present and three stages of decimation are effected. In the tables, lead 2041 is presumed to supply logic states 0 or 1 at each stage of decimation.

| STAGE 1 | | |
|---|---|---|
| Element | 1501 | 1502 |
| Configured as | $C_1$ | $C_1$ |
| Channel | 1561,1562 | 1563,1564 |
| Connects to | 1551,1554 | 1552,1553 |

| STAGE 2 | | |
|---|---|---|
| Element | 1501 | 1502 |
| Configured as 2041 | | |
| 0 | $C_1$ | $C_1$ |
| 1 | $C_1$ | $C_2$ |
| Channel | 1561,1562 | 1563,1564 |
| Connects to 2041 | | |
| 0 | 1551,1554 | 1552,1553 |
| 1 | 1552,1553 | 1551,1554 |

| STAGE 3 | | |
|---|---|---|
| Element | 1501 | 1502 |
| Configured as 2041 | | |
| 00 | $C_1$ | $C_1$ |
| 01 | $C_1$ | $C_2$ |
| 10 | $C_2$ | $C_1$ |
| 11 | $C_1$ | $C_1$ |
| Channel | 1561,1562 | 1563,1564 |
| Connects to 2041 | | |
| 00 | 1551,1554 | 1552,1553 |
| 01 | 1552,1553 | 1551,1554 |
| 10 | 1551,1554 | 1555,1556 |
| 11 | 1555,1556 | 1551,1554 |

Figure 16:
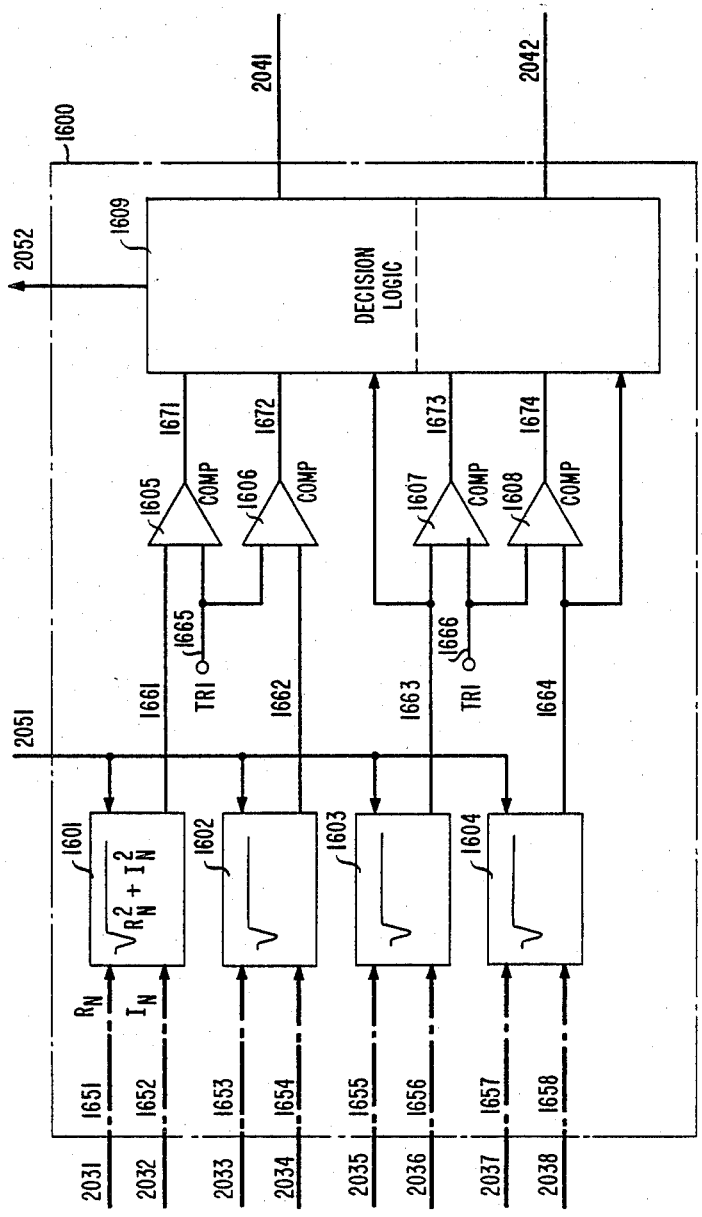
FIG. 16 is a diagram, partly in block form and partially in schematic, depicting one form of the decision unit from FIG. 9.

Decision unit 1600 has a two-fold purpose: (i) forming the modulus of each real-imaginary pair present on the two channel pairs (2031,2032) and (2033,2034) (or in the case of a two-tone detection system, channel pairs (2031,2032) through (2037,2038)); and (ii) determining, at each stage, in which of the two filters (1501 or 1502) the tone is detected (and in the case of a two-tone detection system, in which of two filters (1503 or 1504), the second tone is present). An illustrative embodiment of decision unit 1600 is shown partly in schematic and partially in block form, in the diagram of FIG. 16. Again for clarity of exposition, channels 2031 through 2038 are shown as single lines 1651 through 1658. Each element 1601 through 1604 forms the modulus of the real-imaginary pair appearing at its input. The modulus is generated only after the processing of four contiguous samples has been completed; lead 2051 from controller 1700 provides the signal to initiate modulus generation. For example, when lead 2051 indicates a modulus computation is required, the words on lines 1651 and 1652 are squared within element 1601 and, additionally, the square root of the sum of the squared components is generated. The result of these mathematical operations on the signals appears on lead 1661. This signal corresponds to the first filter position, that is, the first half of a subband. Similarly, the signal appearing on lead 1662 corresponds to the second half of the subband undergoing processing. Similar remarks then apply with respect to the signals on leads 1663 and 1664 in a two-tone detection system.

Although the preceding discussion has focused on obtaining the modulus of each output, it is clear that the square of the modulus is an appropriate signal to supply to the comparator stages (to be discussed shortly). Only the threshold level, provided for detecting the presence or absence of a signal, need be adjusted with the signal supplied to the comparators. An example of a useful approximation to the modulus is the linear one given by $$\text{Max}(|x_n|,|y_n|)+a\,\text{Min}(|x_n|,|y_n|),$$

where $x_n$ and $y_n$ are the $n^{th}$ elements of the in-phase (real) and quadrature (imaginary) sequences produced by a filter pair, the operators denoted "Max" and "Min" detect the maximum and minimum, respectively, from the set of sample values $(x_n, y_n)$, and a is a scalar multiplier. In a binary system, a is typically $\frac{1}{4}$ so that multiplication by a corresponds to two shift operations.

The signals on leads 1661 and 1662 are compared to threshold TR1, which appears on lead 1665, via comparators 1605 and 1606, respectively. The threshold value TR1 is obtained by evaluating $|z(C_1,n,\theta)|$ representing the first decimation stage for $\theta=\pi/4$ and the maximum threshold is given by, in general, for any N where N is the number of samples processed:

$$A\left|\frac{\sin\frac{N\pi}{8}}{\sin\frac{\pi}{8}}\right|.$$

The signals on leads 1663 and 1664 are also compared to threshold TR1, which appears on lead 1666, in comparators 1607 and 1608, respectively.

Decision logic 1609 decodes the results of the comparisons in comparators 1605 through 1608. The decoding yields two bits of information at each stage indicating in which subband each tone is detected. The decoded information appears on lead 2041 for the tone in band (0, f$_s$/4) Hz and on lead 2042 for the second tone. The decision logic for each stage of decimation with respect to the first tone is as follows: if the signal on lead 1661 is greater than both TR1 and the signal on lead 1662, then the tone lies in the first subband; if the signal on lead 1662 is greater than both TR1 and the signal on lead 1661, then the second subband is selected. Of course, if no signals are greater than the corresponding threshold, it is decided no signal is present and this indication is passed to controller 1700 via lead 2052. Other error conditions may also be tested in the logic of element 1609, including checking for two or more signals in excess of the corresponding threshold. Also, a simplified algorithm requiring only a threshold check at the first stage of decimation may be devised. Moreover, an algorithm substantially identical to the one chosen for decoding the first tone may be utilized in the second tone detection path.

As an example of sequential output signals generated on lead 2041, it is supposed that an input tone is in the second subband of stage one. Then the output on lead 2041 is (1). If the tone s in the first subband during stage two, then the sequence (10) appears on lead 2041. Finally, if the tone falls within the second subband during stage three, (101) obtains. To array (101) formed by grouping sequential outputs from lead 2041 is an indication of the frequency cell containing the tone and is provided by main controller 1700 at the completion of the last stage of decimation.

Main controller 1700 of FIG. 9 provides overall system timing, via master clock 1701, and any additional control signals required by subsystems 1300 through 1600. Moreover, controller 1700 conveniently provides feed forward and feedback paths to communicate signals generated by or for subsystems 1200 through 1600. Each of these signals has been discussed in the foregoing description of each related subsystem and therefore requires no additional elaboration. Finally, controller 1700 stores and, when required, indicates the subband location of the tone after the completion of the successive stages of decimation.

With respect to timing, master clock 1701 generally operates at a rate greater than or equal to sampling clock 1205 (see FIG. 12). Oftentimes, however, to utilize system hardware more effectively, some subsystem components may be operated in a time-shared mode. For example, one pair of cyclotomic filters, or even one cyclotomic filter, may be time-shared during processing. Consequently, master clock 1701 will operate at a rate significantly greater than the rate of clock 1205.

Controller 1700 may also be structured to increase detection capability by employing statistical averaging. One way to accomplish that is, at each stage of decimation, to repeat the filter processing a number of times before advancing to the next stage of decimation. Each repetition processes a different set of samples. The required sample sets may be provided by increasing the size of the storage in buffer 1300. A simple algorithm is to repeat each stage an odd number of times and use a majority rule. Another way to take advantage of statistical averaging is to repeat a number of iterations of the three-stage decimation process with or without stage-by-stage averaging. Controller 1700 is then adapted to control the desired number of repetitions.

It is to be understood that the first-order recursive tone detection system, and associated methodology, described herein is not limited to specific forms disclosed by way of example and illustration, but may assume other embodiments limited only by the scope of the appended claims.

We claim:

1. Circuitry for detecting the frequency of a discrete-time input signal
   CHARACTERIZED BY
   control means (1700) for operating on said input signal by sequentially decimating said input signal to provide a decimated signal; and
   first-order, modulus-one recursive filter means (1500), responsive to said control means, for receiving and processing said decimated signal.

2. Circuitry as recited in claim 1 wherein said recursive filter means comprise at least one time-shared first-order cyclotomic filter.

3. Circuitry as recited in claim 1 wherein said recursive filter means are partitioned into sequentially operating stages of filter arrays, each of said arrays being responsive to said control means and arranged to receive and process said decimated signal based on the output of each preceding array.

4. Circuitry as recited in claim 3 wherein the number of said stages corresponds to the number of separate stages of decimation provided by said control means.

5. Circuitry as recited in claims 1, 2, 3 or 4 further comprising means (1600), responsive to both said filter means and said control means, for receiving the output of said filter means and for identifying said frequency from said filter output.

6. Circuitry as recited in claim 5 wherein said circuitry includes means (1400), responsive to said control means, for receiving and frequency-shifting said decimated signal and for transmitting said frequency-shifted signal to said filter means.

7. Circuitry as recited in claim 5 wherein said means for identifying further comprises means (1609) for receiving and decoding said filter output, the output of said means for decoding providing a feedback signal to said control means to configure said filter means at each stage of decimation.

8. Circuitry for detecting and estimating the frequency of a discrete-time input signal
   CHARACTERIZED BY
   discrete-time, first-order, modulus-one recursive filter means (1500) for receiving and processing said signal;
   control means (1700), including a clock (1701), coupled to said filter means for sequentially driving said filter means with said clock and preselected submultiples thereof to provide sequential outputs from said filter means; and
   means (1600), responsive to both said flter means and said control means, for testing and providing an indication of the status of said signal from said sequential outputs, each of said outputs corresponding to said clock or one of said preselected submultiples.

9. A tone detection system for determining the frequency of in-phase and quadrature tones
CHARACTERIZED BY
control means (1700) for processing said tones by sequentially decimating said tones in the ratio 2:1 at each stage of decimation to produce decimated in-phase and quadrature tones,
modulus-one multiplier means (1400) for receiving said decimated in-phase and quadrature tones and for producing frequency-shifted versions of said decimated tones, and
an array (1500) of first-order, modulus-one recursive filters (1501 and 1502 or 1503 and 1504) arranged as two filter pairs, wherein each of said pairs comprises substantially identical ones of said filters,
said array adapted for receiving and processing said decimated tones and said frequency-shifted versions and, in response to said control means, for configuring said pairs to provide a symmetric frequency characteristic at each stage of decimation to cover the frequency band containing said tones with two contiguous subbands.

10. A detection system for receiving and estimating the frequency of an input tone
CHARACTERIZED BY
means (1100) for receiving and transforming said input tone into components including in-phase and quadrature tones corresponding to said input tone;
means (1200), coupled to said means for transforming, for sampling said components at preselected sample rates determined by an initial rate and submultiples thereof to obtain sampled versions of said components;
means for processing said sampled versions at each of said sample rates comprising
    means (1400) for receiving and frequency-shifting said sampled versions to obtain shifted sampled versions thereof,
    first-order, modulus-one recursive filter means (1500), responsive to said frequency-shifting means and said sampling means, for processing said sampled versions and said shifted sampled versions, and
    means (1600), responsive to said filter means, for detecting said tone by comparing the output magnitudes from said filter means after a fixed number of processed samples;
means (1700), coupled to said detecting means and said filter means, for configuring said filter means to provide a preselected frequency response dependent on the output from said detecting means; and
means (1700), responsive to said detecting means, for identifying the final frequency subband containing said tone from successive outputs of said detecting means.

11. Circuitry as recited in claim 10 wherein said further comprises means (1609), responsive to said filter means, for decoding the outputs from said filter means and providing a feedback signal (2041,2042) to said means for configuring based on predetermined relations among said outputs of said filter means.

12. Circuitry as recited in claim 11 wherein said recursive filter means comprises only digital cyclotomic filters (1501 and 1502 or 1503 and 1504) and said initial rate is at least two times the highest frequency expected for said tone and said submultiples reduce said initial rate by factors of two.

13. Multiband filter circuitry for determining if an input signal includes a tone within said multiband, said circuitry comprising
means (1100) for receiving and Hilbert transforming said input signal to obtain the Hilbert signal,
means (1200), responsive to said input signal and said means for Hilbert transforming, for separately sampling said input signal and said Hilbert signal,
multiband first-order, modulus-one recursive filter means (1500), coupled to said sampling means, for processing the outputs from said means for sampling,
means (1601 or 1602-1604), responsive to said filter means after a predetermined number of sample operations, for combining said sampled input and said sampled Hilbert signal to form their magnitude signal, and
detector means (1605 or 1606-1608) for receiving and comparing said magnitude to a preselected threshold (1665 or 1666) and for indicating the presence of said tone whenever said threshold is exceeded.

14. Circuitry as recited in claim 13 wherein said recursive filter means includes a digital filter (1501 through 1504) having a difference equation representation of $x_n = x_{n-1} + \mu_n$, where $\mu_n$ and $x_n$ are the input and output signals of said filter, respectively, at sample time n.

15. Circuitry as recited in claim 13 wherein said recursive filter means includes a digital filter (1501 through 1504) having a difference equation representation of $x_n = -x_{n-1} + \mu_n$, where $\mu_n$ and $x_n$ are the input and output signals, respectively, at sample time n.

16. Circuitry as recited in claims 14 or 15 wherein said preselected threshold (1665 or 1666) equals substantially $$A \left| \frac{\sin \frac{N\pi}{8}}{\sin \frac{\pi}{8}} \right|,$$

where A equals the amplitude of said tone and N equals said predetermined number of sample operations.

17. Multiband filter circuitry for determining if an input signal includes a tone within said multiband, said circuitry comprising
means (1100) for receiving and Hilbert transforming said input signal to obtain the Hilbert signal,
means (1200), responsive to said input signal and said means for Hilbert transforming, for separately sampling said input signal and said Hilbert signal to obtain a sampled input signal and a sampled Hilbert signal,
multiband first-order modulus-one recursive filter means (1500),
modulus-one multiplier means (1400) for interconnecting said sampled input signal and said sampled Hilbert signal with said filter means,
means (1601 or 1602-1604), responsive to said filter means after a predetermined number of sample operations, for combining said sampled input signal and said sampled Hilbert signal to form their magnitude signal, and detector (1600) means for receiving and comparing said magnitude to a preselected threshold (1665 or 1666) and for indicating the presence of said tone whenever said threshold is exceeded.

18. Circuitry as recited in claim 17 wherein said recursive filter means includes a digital filter (1501 through 1504) having a difference equation representation of $x_n = x_{n-1} + \mu_n$, where $\mu_n$ and $x_n$ are the input and output signals, respectively, at sample time n.

19. Circuitry as recited in claim 17 wherein said recursive filter means includes a digital filter (1501 through 1504) having a difference equation representation of $x_n = -x_{n-1} + \mu_n$, where $\mu_n$ and $x_n$ are the input and output signals, respectively, at sample time n.

20. Circuitry as recited in claim 18 or 19 wherein said preselected threshold (1665) equals substantially $$A \left| \frac{\sin \frac{N\pi}{8}}{\sin \frac{\pi}{8}} \right|,$$

where A equals the amplitude of said tone and N equals said predetermined number of sample operations.

21. Multiband filter circuitry for determining if an input signal includes a tone within said multiband, said circuitry comprising
 means (1100) for receiving and phase-shifting said input signal to produce a quadrature signal,
 means (1200), responsive to said input signal and said quadrature signal, for independently sampling said input signal and said quadrature signal to obtain a sampled input and a sampled quadrature signal,
 first and second multiband first-order digital cyclotomic filter means (1500) having substantially identical filter characteristics,
 first means (1401,1461,1464,1465,1468,1471,1473,1475,1477) for sequentially and periodically connecting said first multiband filter, on a per sample basis, with: said sampled input signal; the negative of said sampled quadrature signal; the negative of said sampled input signal; and said sampled quadrature signal,
 second means (1401,1462,1463,1466,1468,1472,1474,1476,1478) for sequentially and periodically connecting said second multiband filter, on a per sample basis, with: said sampled quadrature signal; said sampled input signal; the negative of said sampled quadrature signal; and the negative of said sampled input signal,
 means (1601–1604), coupled to said filter means, for independently squaring the outputs of said first and second filter means,
 means (1601–1604), responsive to said means for squaring, for adding the outputs of said means for squaring,
 means (1601–1604), connected to said means for adding, for square-rooting the output of said means for adding, and
 detector means (1605–1608, 1609) for receiving and comparing the output of said means for square-rooting to a preselected threshold and for indicating the presence of said input tone whenever said threshold is exceeded after a predetermined number of sampling operations.

22. Multiband filter circuitry for determining if an input signal includes a tone within said multiband, said circuitry comprising
 means (1100) for receiving and phase-shifting said input signal to produce a quadrature signal,
 time-shared means (1200), responsive to said input signal and said quadrature signal, for sampling said input signal and said quadrature signal to obtain a sampled input signal and a sampled quadrature signal,
 time-shared multiband, first-order digital cyclotomic filter means (1500),
 modulus-one multiplier means (1400) for interconnecting said sampled input signal and said sampled quadrature signal to said filter means,
 arithmetic means, responsive to said filter means after a predetermined number of sampling operations, including
  means (1601–1604) for receiving and squaring the outputs of said filter means corresponding to said input signal and said quadrature signal, and
  means (1601–1604), responsive to said means for squaring, for adding the resultant squares, and
 detector (1605–1608,1609,1665,1666) means for receiving and comparing the output of said arithmetic means to a preselected threshold and for indicating the presence of said input tone whenever said threshold is exceeded.

23. Detection circuitry for determining if an input signal includes a tone within one of two bands, said circuitry comprising;
 means (1100) for receiving and Hilbert transforming said input signal to obtain the Hilbert signal;
 means (1200), responsive to said input signal and said means for Hilbert transforming, for separately sampling said input signal and said Hilbert signal to obtain a sampled input signal and a sampled Hilbert signal;
 digital filter means (1500), coupled to said means for sampling, including
  a first digital filter pair (1501 or 1503), each having substantially identical characteristics represented by a first order cyclotomic polynomial, one of said first pair responsive to said sampled input signal and the other responsive to said sampled Hilbert signal,
  a second digital filter pair (1502 or 1504), each having substantially identical characteristics represented by a first order cyclotomic polynomial, one of said second pair responsive to said sampled input signal and the other responsive to said sampled Hilbert signal, and
  modulus-one multiplier means (1400) for interconnecting said sampled input signal to one filter from said pairs, and for interconnecting said sampled Hilbert signal to the other of said pairs;
 means (1601–1604), responsive to said filter means after a predetermined number of sample operations, for generating separate moduli corresponding to the respective outputs of said first pair and said second pair; and
 detector means (1609), responsive to said means for generating, for comparing each of said moduli to a preselected threshold (1665 or 1666) and for indicating the presence of said tone in the appropriate one of said bands whenever said threshold is exceeded.

24. A frequency measuring system for detecting and estimating the frequency of an analog tone
CHARACTERIZED BY
  means (1100) for receiving and transforming said tone to obtain both a real tone corresponding to a phase-shifted version of said tone and an imaginary tone corresponding to the quadrature of said real tone;
  means (1200), responsive to said means for transforming, for sampling said real tone and said imaginary tone to provide a sequence of real and imaginary words grouped as word pairs;
  buffer means (1300), coupled to said means for sampling, for storing a plurality of said word pairs;
  modulus-one means (1400), connected to said buffer means, for generating frequency-shifted real words and imaginary words from selected ones of said word pairs;
  digital filter means, responsive to said modulus-one means and said buffer means, comprising two pairs of first-order cyclotomic filters (1501,1502, or 1503,1504), with one filter from each of said pairs arranged to process said real words and frequency-shifted real words and the other arranged to process said imaginary words and frequency-shifted imaginary words; and
  decision means (1600), responsive to said filter means, for generating the modulus of the output of each of said pairs of filters and indicating the appropriate frequency subband containing said tone based on predetermined relationships involving each said modulus.

25. A frequency-measuring system for detecting and estimating the frequency of a continuous tone input
CHARACTERIZED BY
  means (1100) for receiving and transforming said tone input to simultaneously obtain both a real tone corresponding to a phase-shifted version of said tone input and an imaginary tone corresponding to the Hilbert transform of said real tone;
  means (1200), responsive to said means for transforming, for sampling said real tone and said imaginary tone to provide a sequence of real and imaginary words grouped as word pairs;
  buffer means (1300) responsive to said means for sampling comprising:
    two essentially identical storage arrangements (1303,1304,1307,1308 or 1305,1306,1309,1310), each of said arrangements including random access storage means (1303-1306) for storing a plurality of said word pairs and memory controllers (1307,1308, or 1309,1310) for enabling said storage means to receive said word pairs;
    an address controller (1302), coupled to said memory controllers, for controlling the alternate gating of blocks of said words from said each of said arrangements to provide said word pairs sequentially to the output of said buffer means; and
    means (1301), interposed between said arrangements and said means for sampling, for alternately selecting and then connecting one of said arrangements to said means for sampling for a preselected number of operations of said means for sampling,
  modulus-one, frequency-shifting means (1400), responsive to said buffer means, including means 1401 for receiving said real and imaginary word pairs and generating
    (i) positively-shifted real words by providing outputs from said frequency-shifting means according to the pattern: the first real word from said pairs; the negative of the second imaginary word from said pairs; the negative of the third real word; the fourth imaginary word, said pattern continuing, with a period of four, for said preselected number of operations,
    (ii) positively-shifted imaginary words by providing outputs from said frequency-shifting means according to the pattern: the first imaginary word from said pairs; the second real word from said pairs; the negative of the third imaginary word; the negative of the fourth real word, said pattern continuing, with a period of four, for said preselected number of operations,
    (iii) negatively-shifted real words by providing outputs from said frequency-shifting means according to the pattern: the first real word from said pairs; the second imaginary word from said pairs; the negative of the third real word; the negative of the fourth imaginary word, said pattern continuing, with a period of four, for said preselected number of operations, and
    (iv) negatively-shifting imaginary words by providing outputs from said frequency-shifting means according to the pattern: the first imaginary word from said pairs; the negative of the second real word from said pairs; the negative of the third imaginary word; the fourth real word, said pattern continuing, with a period of four, for said preselected number of operations,
  digital filter means (1500) comprising:
    a bank of first and second pairs of real, first-order cyclotomic filters (1501,1502 and 1503,1504) with one filter from each of said pairs arranged to process said real words generated by said means for frequency-shifting and the other to process said imaginary words generated by said means for frequency-shifting; and
    selection logic means (1505), interposed between said bank and said frequency-shifting means, for providing each of said filters with an appropriate sequence of words from said frequency-shifting means,
  decision means (1600), responsive to said bank, comprising:
    means (1601 and 1602) for generating the modulus of the output of each of said two pairs of filters;
    means (1605–1608) for comparing each said modulus to a threshold after said preselected number of samples have been processed; and
    decision logic means (1609) for indicating the appropriate spectral subband containing said tone based on predetermined relationships among the outputs from said means for comparing, and
  main controller means (1700) comprising:
    means (1701) for controlling decimation;
    means for operating said address controller to provide said blocks in response to said means for controlling decimation;
    means for driving said selection means to supply said appropriate sequence of words in response to said means for controlling decimation and said spectral subband determined from said outputs of said means for comparing; and means for configuring said filter means in response to said means for controlling decimation and said spectral subband.

26. The system as recited in claim 25 wherein said digital filter means and said selector means are arranged to provide filter responses, on successive stages of decimation by factors of 2, according to the following pattern:
(i) during the first stage of decimation, said system processes said tone input with said pairs configured as $C_1$ and $C_{4p}$, respectively,
(ii) during the second stage of decimation, said system processes said tone input with said pairs configured as: $C_1$ and $C_{4p}$, respectively, if said modulus from said first pair exceeds said modulus from said second pair at the completion of said first stage of decimation; and as $C_{4p}$ and $C_2$, respectively, otherwise,
(iii) during the third stage of decimation, said system processes said tone input with said pairs selected from one of the following four filter sets: $\{C_1, C_{4p}\}$; $\{C_{4p}, C_2\}$; $\{C_2, C_{4m}\}$; $\{C_{4m}, C_1\}$, depending on the location of said tone within one of the four possible subbands of the original band at the completion of said second stage of decimation, and
(iv) during the fourth and succeeding stages of decimation, said system processes said tone input with said pairs selected as one of said four sets so that each group of four frequency subbands covered on the preceding stage of decimation is covered by the frequency response of the union of said four sets on the present stage of decimation.

27. The system as recited in claim 25 wherein
the modulus of said first and second pairs of said filters is representative of the strength of said tone input appearing, respectively, in the first and second halves of said subband, and
said predetermined relationships provide an indication of the presence of said tone in the half of said subband corresponding to the associated modulus whenever:
said first modulus is greater than said threshold and said second modulus; and
said first modulus is less than said threshold and said second modulus is greater than said threshold.

28. A method for detecting the frequency of a discrete-time input signal
CHARACTERIZED BY the steps of
sequentially decimating said input signal to provide a decimated signal; and
processing said decimated signal with first-order modulus-one recursive filter means.

29. The method as recited in claim 28 further comprising the step of identifying said frequency from sequential outputs of said filter means.

30. The method as recited in claim 29 further comprising the step of frequency shifting said decimated signal before processing by said filter means.

31. The method as recited in claim 30 further comprising the steps of
detecting said outputs and providing decoded versions of said outputs, and
configuring said recursive filter means in response to said decoded versions.

32. A method for estimating the frequency of an input tone
CHARACTERIZED BY THE STEPS OF
(i) transforming said input tone into components including in-phase and quadrature tones corresponding to said input tone,
(ii) providing a sampling signal having an initial rate and first-order, modulus-one recursive filter means with an initial frequency characteristic defined over a frequency band determined by said rate,
(iii) sampling said components at said rate to obtain sampled versions of said tones,
(iv) frequency-shifting said sampled versions to obtain shifted sampled versions thereof,
(v) filtering said sampled versions and said shifted versions thereof with said filter means,
(vi) detecting said tone by comparing the output magnitudes from said filter means after a fixed number of samples to locate a subband of said band containing said tone,
(vii) determining if said location of said subband provides a sufficient estimate to the frequency of said tone and, if so, proceeding to step (x),
(viii) decreasing said rate by a predetermined factor,
(ix) reconfiguring said filter means as determined by said location and said rate, and proceeding to step (v), and
(x) identifying the final estimate to the frequency of said tone as said location used to arrive at this step from step (vii).

* * * * *

UNITED STATES PATENT AND TRADEMARK OFFICE
CERTIFICATE OF CORRECTION

PATENT NO. : 4,361,875
DATED : November 30, 1982
INVENTOR(S) : David Hertz, Robert P. Kurshan and David Malah It is certified that error appears in the above-identified patent and that said Letters Patent is hereby corrected as shown below:

Column 7, line 49, "+" first occurrence, should read --$\pm$--. Column 8, line 18, "($\pi$)/(2)" should read --$\frac{\pi}{2}$--; line 67, "$\theta=(\pi)/(4)$" should read --$\theta=\frac{\pi}{4}$--. Column 9, line 53, "(0.2$\pi$)" should read --(0,2$\pi$)--. Column 11, line 38, "designated" should read --designates--; line 65, "samples" should read --sample--. Column 12, line 53, "(+$\pi$)/(2)" should read --+$\frac{\pi}{2}$--. Column 15, line 39, "To" should read --The--; line 67, "that" should read --this--.

Signed and Sealed this

Eleventh Day of October 1983

[SEAL]

Attest:

GERALD J. MOSSINGHOFF

*Attesting Officer*     *Commissioner of Patents and Trademarks*